(12) United States Patent
Baumgartner et al.

(10) Patent No.: US 8,850,372 B2
(45) Date of Patent: Sep. 30, 2014

(54) METHOD AND SYSTEM FOR PERFORMING INVARIANT-GUIDED ABSTRACTION OF A LOGIC DESIGN

(71) Applicant: International Business Machines Corporation, Armonk, NY (US)

(72) Inventors: Jason Raymond Baumgartner, Austin, TX (US); Alexander Ivrii, Haifa (IL); Arie Matsliah, Haifa (IL); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/656,396

(22) Filed: Oct. 19, 2012

(65) Prior Publication Data

US 2014/0115548 A1    Apr. 24, 2014

(51) Int. Cl.
*G06F 17/50* (2006.01)
*G06F 11/22* (2006.01)
*G06F 9/455* (2006.01)

(52) U.S. Cl.
USPC .............................. 716/106; 716/136; 703/13

(58) Field of Classification Search
None
See application file for complete search history.

(56) References Cited

U.S. PATENT DOCUMENTS

| | | | |
|---|---|---|---|
| 7,290,230 B2 * | 10/2007 | Prasad ........................... | 716/106 |
| 7,299,432 B2 * | 11/2007 | Baumgartner et al. ........ | 716/104 |
| 7,356,792 B2 | 4/2008 | Baumgartner et al. | |
| 7,360,186 B2 | 4/2008 | Sidle et al. | |
| 7,742,907 B2 * | 6/2010 | Gupta et al. ................... | 703/14 |
| 7,743,353 B2 | 6/2010 | Baumgartner et al. | |
| 7,752,593 B2 * | 7/2010 | Baumgartner et al. ........ | 716/104 |
| 7,917,884 B2 | 3/2011 | Baumgartner et al. | |
| 7,930,659 B2 | 4/2011 | Ivancic et al. | |
| 8,271,404 B2 | 9/2012 | Gulwani et al. | |

OTHER PUBLICATIONS

Thalmaier et al., Analyzing k-step Induction to COmpute Invariants for SAT-based Property Checking, 47th ACM/IEEE Design Automation Conference, pp. 176-181, 2010.*
P. Chauhan, et al., "Automated Abstraction Refinement for Model Checking Large State Spaces Using SAT Based Conflict Analysis," FMCAD, 2002.
K. McMillan and N. Amla, "Automatic Abstraction without Counterexamples," TACAS 2004.
K. McMillan and N. Amla, "A Hybrid of Counterexample-based and Proof-based Abstraction," FMCAD 2004.
Aaron Bradley, "SAT-based Model Checking without Unrolling," VMCAI 2011.

* cited by examiner

*Primary Examiner* — A. M. Thompson
(74) *Attorney, Agent, or Firm* — Yudell Isidore Ng Russell PLLC; Matthew Baca

(57) ABSTRACT

A computer-implemented method of invariant-guided abstraction includes a processor of a computing device generating one or more invariants corresponding to a design under verification by executing a proof algorithm with an input comprising at least a portion of the design and a specified resource limit. The method further includes deterministically assigning priority information to the one or more invariants generated and to components of the design referenced by said invariants. Finally, the method includes performing invariant-guided localization abstraction on the design model to generate an abstracted design model utilizing the assigned priority information as a localization hint that results in abstractions that are at least one of (a) smaller abstractions and (b) easier to verify abstractions.

27 Claims, 8 Drawing Sheets

METHOD AND SYSTEM FOR PERFORMING INVARIANT-GUIDED ABSTRACTION OF A LOGIC DESIGN

BACKGROUND

1. Technical Field

The present disclosure generally relates to verification techniques for logic design and in particular to techniques for performing abstraction of logic design using invariants generated over the logic design.

2. Description of the Related Art

Automated property checking techniques hold considerable promise to mitigate what has become one of the most important problems facing the semiconductor industry today: the "verification crisis". Through the advent of numerous advanced proof, falsification, abstraction and reduction techniques, formal property checking has scaled to the necessary level to address many practical industrial applications, and has become an essential CAD technology. However, many problems remain beyond the capacity of current property checking algorithms, thus continued advances are of critical importance.

BRIEF SUMMARY

Disclosed are a method, a computing device and a computer program product that implement invariant-guided abstraction within a design under verification. According to a first embodiment, a computer-implemented method includes a processor of a computing device: initiating a verification process for an identified design; and generating one or more invariants corresponding to the design under verification by executing a proof algorithm. The proof algorithm is implemented with an input comprising at least a portion of the design and a specified resource limit. The method also includes deterministically assigning priority information to the one or more invariants generated, and to components of said design referenced by said invariants. The method also includes performing invariant-guided localization abstraction on the design model to generate an abstracted design model utilizing the assigned priority information as a localization hint that results in abstractions that are at least one of (a) smaller abstractions and (b) easier to verify abstractions.

According to one aspect of the method, executing the proof algorithm includes: establishing the pre-specified limit to enable less than a complete run of the proof algorithm on the design model, where the pre-specified resource limit is selected from among a time limit, a depth limit, and a hardware resource usage limit; and executing the proof algorithm for only the preset limit. Accordingly, the proof algorithm iterates over a series of timesteps/timeframes corresponding to states extending from an initial state ($t_o$) to a subsequent state ($t_k$) at which a proof condition holds true over a first k timesteps for a set of bounded invariants identified at the respective states. The set of bounded invariants hold true for a particular state from the initial state, and the invariants each refer to one or more components of said design. A subset of the bounded invariants may be determined to be unbounded invariants, which hold for all timeframes, even beyond k.

Additional aspects of the method include: incrementally refining and extending a sequence of sets of invariants representing bounded invariants and determining a relevance of the one or more design components referenced in the invariant clauses. In one embodiment, these aspects involve: evaluating, for each invariant, whether the invariant is an unbounded invariant that is first introduced at a specific timestep between the initial and the kth timestep; deterministically assigning relative priorities to one or more design components referenced in the invariant based on whether the invariant is an unbounded invariant and the specific timestep at which the unbounded invariant is introduced; determining for each design component referenced by an invariant, if the design component has a priority that is equal to a highest priority assigned among the design components; and in response to the design component not having a priority equal to the highest priority assigned, identifying the design component as a cutpoint and replacing the design component with the cutpoint within the abstracted design. In an alternate embodiment, however, the above assigning of relative priorities occurs based on the specific timestep at which the invariant is introduced and irrespective of whether the invariant is bounded or unbounded. As such, no evaluation of the type (bounded or unbounded) of invariant is performed or required for this alternate embodiment.

According to one aspect of the method, performing the localization abstraction process comprises: initializing the localization abstraction process with every design component replaced by a cutpoint; performing satisfiability-based (SAT-based) bounded model checking (BMC) for a first timestep on the abstracted design; identifying and analyzing spurious counterexamples; refining the localization abstraction by adding sufficient design components, to the abstracted design to eliminate the spurious counterexamples, where the design components added are selected based on an analysis of assigned priorities for the design components. Additionally, this aspect of the method includes: in response to completion of elimination of spurious counterexamples at a specific timestep, performing proof-based abstraction (PBA) up to that specific timestep to eliminate unnecessary logic from the abstracted design; and incrementing the timestep and iterating through processes including the performing SAT-based BMC, the identifying and analyzing, the refining, and the performing PBA processes up to the configured resource limit, where counterexample based abstraction (CBA) and proof-based abstraction (PBA) are interleaved utilizing the assigned priorities of the design components to complete the refining.

A second embodiment of the disclosure provides a computer program product comprising: a computer readable device; and program code on the computer readable device, which program code is configured to be executed by a processor within a computing device to cause the computing device to: initiate a verification process for an identified design; generate one or more invariants corresponding to the design under verification by executing a proof algorithm with an input comprising at least a portion of the design and a specified resource limit; deterministically assign priority information to the one or more invariants generated, and to components of said design referenced by said invariants; and perform invariant-guided localization abstraction on the design model to generate an abstracted design model utilizing the assigned priority information as a localization hint that results in abstractions that are at least one of (a) smaller abstractions and (b) easier to verify abstractions.

Yet a third embodiment of the disclosure provides a computing device comprising a processor, an input device, an output device, and a memory having program code that is executed by the processor. The computing device: initiates a verification process for an identified design; generates one or more invariants corresponding to the design under verification by executing a proof algorithm with an input comprising at least a portion of the design and a specified resource limit; deterministically assigns priority information to the one or more invariants generated, and to components of said design referenced by said invariants; and performs invariant-guided localization abstraction on the design model to generate an abstracted design model utilizing the assigned priority information as a localization hint that results in abstractions that are at least one of (a) smaller abstractions and (b) easier to verify abstractions.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein.

DETAILED DESCRIPTION

Figure 1:
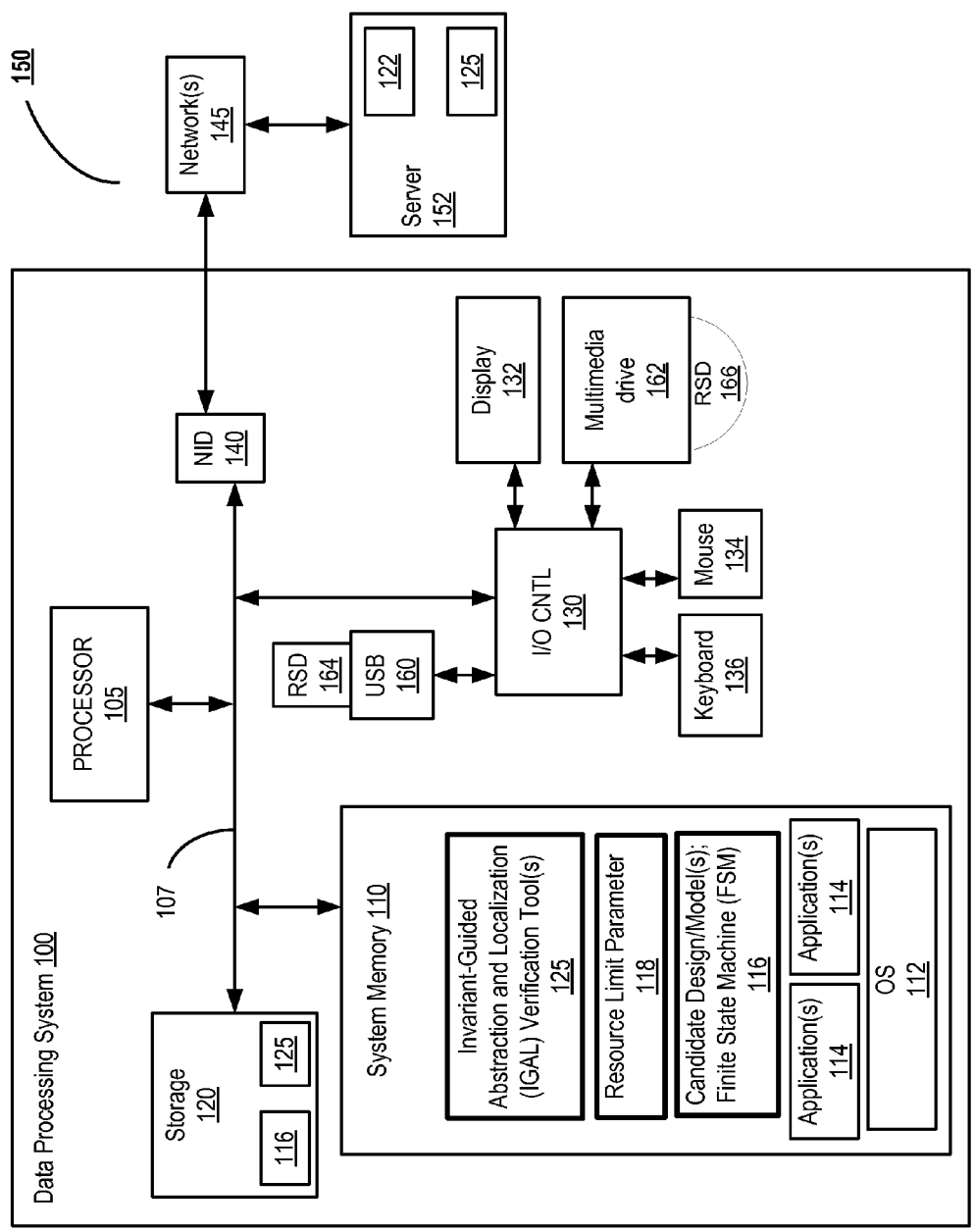
FIG. 1 provides a block diagram representation of an example data processing system within which the various embodiments of the disclosure can advantageously be implemented, according to one embodiment.

The illustrative embodiments provide a method, a computing device and a computer program product that implement a technique for performing invariant-guided abstraction which improves the quality of localization and ultimately boost the scalability of subsequent verification algorithms. Specifically, one aspect of the disclosure provides a computer-implemented method of invariant-guided abstraction. The method includes a processor of a computing device generating one or more invariants corresponding to a design under verification by executing a proof algorithm with an input comprising at least a portion of the design and a specified resource limit. The method also includes deterministically assigning priority information to the one or more invariants generated, and to components of the design referenced by said invariants. And, the method further includes performing invariant-guided localization abstraction on the design model to generate an abstracted design model utilizing the assigned priority information as a localization hint that results in abstractions that are at least one of (a) smaller abstractions and (b) easier to verify abstractions.

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein.

It is understood that the use of specific component, device and/or parameter names (such as those of the executing utility/logic described herein) are for example only and not meant to imply any limitations on the disclosure. The disclosure may thus be implemented with different nomenclature/terminology utilized to describe the components/devices/parameters herein, without limitation. Each term utilized herein is to be given its broadest interpretation given the context in which that terms is utilized. The below paragraphs thus introduces certain terminology and concepts that is utilized within the descriptions of the various embodiments of the disclosure.

Throughout the following description, aspects of the disclosure refer to the use of localization and abstraction in design models. As introduced herein, "localization" refers to and/or is a powerful abstraction technique which reduces the size of a verification problem by replacing gates in the design by "cutpoints". Once introduced in the design, the cutpoints then act as unconstrained nondeterministic variables. Because the cutpoints may simulate the behavior of the original gates, localization overapproximates the behavior of a design. Thus, while the approach is sound, the approach is also incomplete. One advancement to the implementation of basic localization techniques involves the use of "refinement" to eliminate spurious failures on the abstract design by eliminating cutpoints that are deemed responsible for the failure. Ultimately, the abstract design is passed to a proof engine. In practically the majority of instances, it is desirable that the abstract design be as small as possible to enable more efficient proofs, while being immune to spurious counterexamples.

Various prior techniques have been proposed to guide the abstraction-refinement process of localization. Most state-of-the-art localization implementations use SAT-based bounded model checking to select the abstract netlist upon which an unbounded proof is attempted, given relative scalability of bounded model checking versus proof techniques. These abstraction processes are either based upon (1) counterexamples obtained on the abstract design, (2) proofs obtained on the original design, or (3) a hybrid of both techniques. In the hybrid approach, the technique includes providing localization-refinement based upon counterexamples produced on the abstract design, and then improving the quality of that abstraction through proofs obtained on the counterexample-based abstract design. In conventional applications, the hybrid approach tends to yield the smallest abstractions, but at the cost of additional runtime. Specifically, the abstraction-refinement process relies upon heuristics and thus can include unnecessary logic, which in turn introduces unnecessary proof complexity.

Various satisfiability-based (SAT-based) unbounded proof techniques have been developed, some of which are very scalable. Among these proof techniques is IC3 (Incremental Construction of Inductive Clauses for Indubitable Correctness) algorithm. One powerful characteristic of IC3 is that, when successful, IC3 execution may yield a proof or counterexample while analyzing only a small approximation of the overall behavior of the design under verification. In the case of a proof, an often-compact inductive invariant is derived. In the case of a counterexample, a directed search from the initial states toward the property found a path, in cases requiring less effort than bounded model checking.

While often efficient, the intrinsic complexity of property checking explains why IC3 often fails to solve a complex problem, given a practical allocation of resources. Furthermore, IC3 intrinsically attempts to analyze the design in an abstract manner. One aspect of the disclosure involves being aware that localization may synergistically boost the scalability of many verification algorithms. Accordingly, one aspect of the disclosure exploits this synergy in at least two ways: (1) extracting design insight from an incomplete invariant-generation based verification algorithm via its (bounded) invariants; and (2) improving the quality of localization, and thereby boosting the scalability of subsequent verification algorithms, such as and/or including IC3, by utilizing the extracted information. It should be noted that while IC3 is one such invariant-generation based verification algorithm that can be used within the disclosure, the disclosure is not limited to any particular proof algorithm and the disclosure is applicable for use with any method for invariant generation, including but not limited to IC3, an interpolation algorithm, and scalable binary decision diagrams (BDDs).

Within the disclosure, IC3 is presented as the example invariant-generation algorithm or proof algorithm. IC3 operates by incrementally refining and extending a sequence $F\_0, \ldots, F\_k$ of sets of clauses (termed "bounded invariants") referring solely to design components, such as state variables, of the design under verification, where $F\_0$ represents the initial states. Throughout the run of IC3, the following invariants are preserved:

$F\_i$ implies $F\_\{i+1\}$ for $0, \ldots, k-1$
$F\_i$ is a superset of the clauses in $F\_\{i+1\}$ for $0, \ldots, k-1$
$F\_i$ implies $F\_\{i+1\}$ under the "transition relation" of the design for $0, \ldots, k-1$
$F\_k$ implies that the property P holds at time k Initially k=1, and the value of k is increased whenever $F\_k$ implies that the property P holds at time k+1. According to one aspect, each $F\_i$ constitutes an overapproximation of the states reachable at time i. While processing bound k, if $F\_k$ fails to ensure that the property holds in the following timeframe, then IC3 attempts to propagate additional information to sets $F\_1, \ldots, F\_\{k-1\}$ to address this potential failure. If IC3 cannot address the failure, this signifies a true counterexample. Otherwise, each added invariant clause is pushed to the highest-possible $F\_i$. Some bounded invariants may be determined to be unbounded invariants, and when that set implies P, an inductive proof has been completed. Additional aspects of the implementation of the proof algorithm, such as IC3, will be provided within the descriptions of FIGS. 3 and 4.

With reference now to the figures, FIG. 1 provides a block diagram representation of an example data processing system (DPS), within which the various computer-implemented methods of the disclosure along with the logic design of one or more candidate netlists can advantageously be implemented. DPS 100 sits within a DPS environment 150 that supports networking and/or other remote functionality of DPS 100. DPS 100 is an example of a computing device that is configured to execute one or more design analysis tools to analyze and reduce a complexity of a logic design under verification/test, including specific tools and/or engines and/or algorithms that enable the various aspects of the described embodiments. DPS 100 can take various forms and can be represented as workstations, laptop computer systems, notebook computer systems, desktop computer systems and/or clusters thereof. While not preferable due to processor size constraints and the high computational requirements of the computer-implemented algorithms presented in the various described embodiments, DPS 100 can also be a smaller processing system, such as a smart phone, tablet PC, and the like, without limitation. DPS 100 includes a processor 105 or central processing unit (CPU), which may include one or more processor cores for executing program code. Processor 105 is coupled to a system memory 110 via a system interconnect or system bus 107. Also connected to processor 105 via system bus 107 are storage 120, input/output (I/O) adapter/controller 130, and network interface device (NID) 140. Coupled to I/O adapter/controller 130 are one or more output devices, of which display 132 is provided as an example, and one or more input devices, of which mouse 134 and keyboard 136 are presented as examples. In one embodiment, storage 120 maintains a copy of one or more designs (or design models) 116, such as a fixed state machine or a netlist, which can be evaluated using the techniques described herein. Storage 120 can also maintain a copy of Invariant-Guided Abstraction and Localization (IGAL) verification tool 125 (hereinafter IGAL tool 125), which represents a combination of the various functions, algorithms and/or executable modules that can be loaded into system memory 110 and executed by processor 105 to implement the different functions presented herein.

Within the network environment 150, DPS 100 is communicatively connected via one or more wired or wireless networks 145, such as the Internet, to a server 152. Server 152 can be, for example, a verification tool server that facilitates download to DPS 100 of various analysis tools (e.g., IC3 and localization tools), which for purposes of this disclosure shall be collectively referred to as IGAL tool 125. Server 152 can also be a design server from which one or more designs 116 can be downloaded for analysis.

Loaded within system memory 110 are various executable program modules and/or software-coded algorithms, including, for example, operating system (OS) 112 of DPS 100, application programs 114 (e.g., a word processing application, a presentation application, and a netlist generation application). As shown, these program modules within system memory 110 also comprise an example candidate (logic) design 116, embodied as a fixed state machine (FSM), and a copy of IGAL tool 125 specific to the disclosure. In one or more embodiments, IGAL tool(s) 125 can include, for example, invariant generation tools/algorithms, prioritization tools/algorithm, localization and abstraction functions/tools, and the like. Each tool and/or algorithm and/or function within IGAL tool(s) 118 can be an independent software module that executes on processor 105 to implement a specific set of computations and/or analyses and/or functions when applied to candidate design 116. In one embodiment, one or both of IGAL tool 125 and candidate design 116 can be loaded from storage 120 prior to execution of IGAL tool 125 by processor 105. In another embodiment, one or both of IGAL tools 125 and candidate design 116 can be downloaded from network server 152 or obtained from an input device, such as a flash drive 164 inserted into or coupled to USB 160 or Compact Disk or Digital Video Device 166 coupled to and/or accessible via multimedia drive 162. Flash drive 164 and CD/DVD 166 are both examples of removable/readable storage devices (RSD), and are represented as such within the figure. One embodiment of the disclosure provides a computer program product, which includes program code or instructions stored on such a removable storage device and executable by processor 105.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

As introduced above, certain aspects of the disclosure involve the execution on or by processor 105 of various algorithms and/or program modules provided by IGAL tools 125 to yield results that can be outputted via one or more output mechanism, such as display 132. These algorithms are coded as modules for execution on processor 105 to evaluate and/or analyze candidate design 116, and the execution by processor 105 and/or DPS 100 of these algorithms provides a computer-implemented method for performing invariant-guided abstraction on a candidate design along with localization processes on the results of the abstractions to boost the scalability of one or more verification algorithm(s). In one embodiment, the method generally includes the functions of: initiating a verification process for an identified design; a processor of a computing device generating one or more invariants corresponding to the design under verification by executing a proof algorithm with an input comprising at least a portion of the design and a specified resource limit; deterministically assigning priority information to the one or more invariants generated, and to components of said design that are referenced by said invariants; and performing invariant-guided localization abstraction on the design model to generate an abstracted design model utilizing the assigned priority information as a localization hint that results in abstractions that are at least one of (a) smaller abstractions and (b) easier to verify abstractions.

Specific functions associated with the above generalized method are described below with reference to particular algorithms embodied within the various flow charts. In addition to the method, embodiments of the disclosure involve a computer program product comprising: a computer readable device; and program code on the computer readable device, which program code is configured to be executed by a processor within a computing device to cause the computing device to perform the above listed method functions. Yet another embodiment provides a computing device comprising a processor, an input device, an output device, and a memory having program code that is executed by the processor, where the computing device performs a series of functions similar to those described in the above introduced method.

Figure 2:
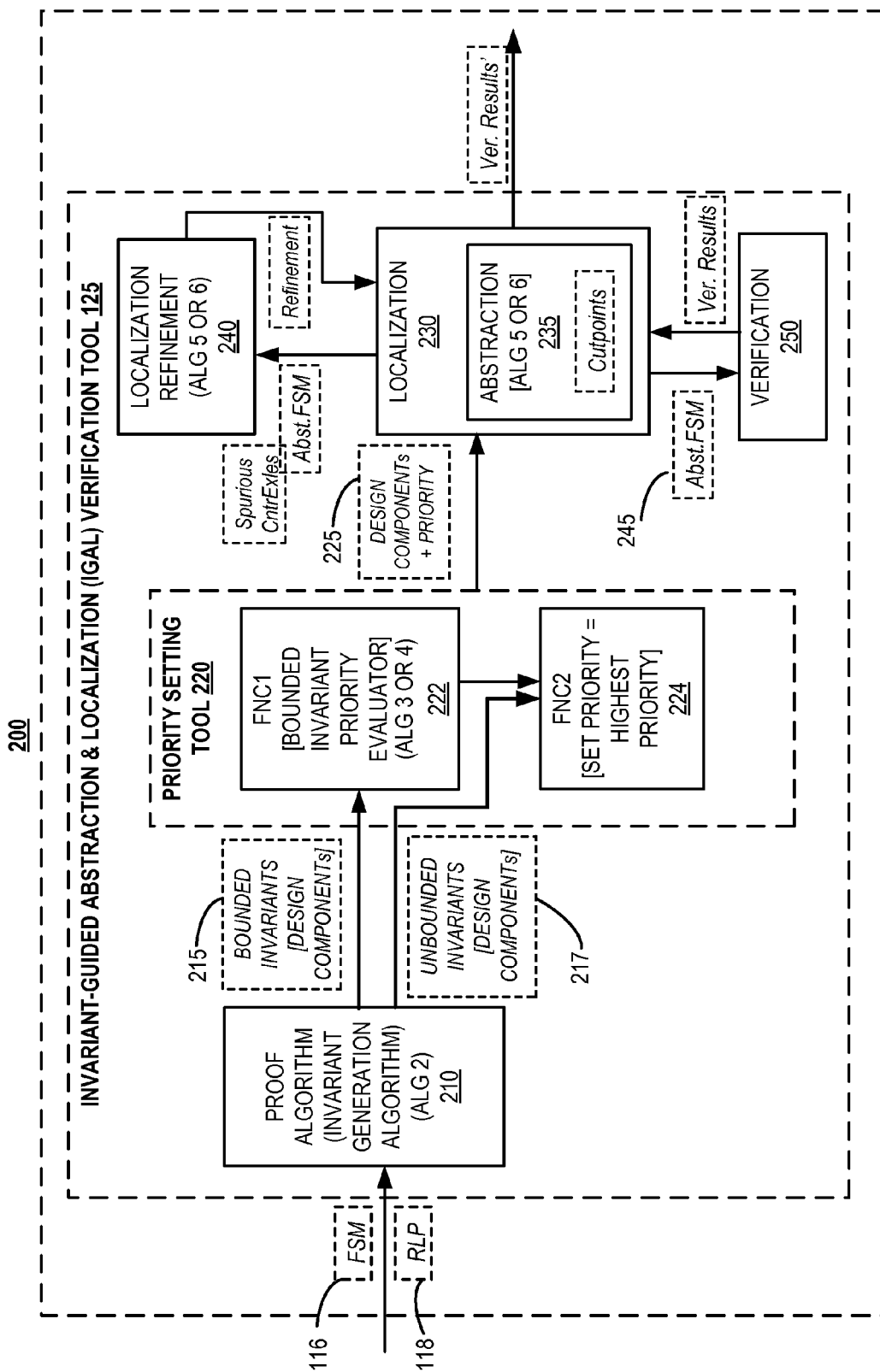
FIG. 2 illustrates a block diagram representation of functional modules of an Invariant-Guided Abstraction & Localization (IGAL) verification tool that collectively implements the functions associated with one or more computer-implementable methods, according to one or more embodiments.

Implementation of these various aspects of the disclosure is provided by execution of several functions and/or algorithms within IGAL tool 125 illustrated in FIG. 2, which is now described. FIG. 2 provides a sequence diagram of a multi-algorithm framework 200, which encompasses several processes that are collectively referred to herein as IGAL tool 125. IGAL tool 125 includes a sequence of four computer-executable program modules, each representing executable code of one of the four algorithms, functions, or tools described herein. Specifically, IGAL tool 125 includes invariant generation algorithm 210, priority setting tool 220, localization tool 230, and localization refinement tool 240. Each of these modules contains specific algorithm(s), indicated in the respective boxes and presented herein with reference to specific flow charts. As indicated, several of the modules can include different algorithms by which the underlying function(s) can be achieved. These different algorithms can then represent alternate embodiments.

Illustrated within multi-algorithm framework 200 are directional links established between the various modules indicating the directional flow of processing from one algorithm to the next algorithm. Illustrated with each intermediate left-to-right directional link is a set of output-input parameters being generated by the module to the left of the arrow and passed as an input to the module at the right of the arrow. When initialized for execution, IGAL tool 125 receives an initial input of candidate design 116, which for purposes of the description is indicated as an FSM 116. According to at least one embodiment, IGAL tool 125 also receives an initial input of resource limit parameter (RLP) 118. As described herein, the RLP is a pre-set or programmed limit for running the proof algorithm 210 on the candidate design. One aspect of the method includes establishing the pre-specified limit (i.e., the RLP 118) to enable less than a complete run of the proof algorithm 210 on the design model (116), where the pre-specified resource limit is selected from among a time limit, a depth limit, and a hardware resource usage limit. Thus, for example, the person running the verification tool can indicate a specific time limit for the proof algorithm 210, such as 10 minutes or 45 minutes. As another example, a specific amount of memory and/or processor resource can be allocated to the proof algorithm 210, such that the algorithm stops executing after 100 processor cycles or 2 GB of storage has been consumed with the intermediate results of the run. As a third example, taking the above-introduce IC3 timesteps, t0 to tk, the value of parameter k can be selected to be less than the total number of timesteps required to analyze the entire design model (116). As previously stated, several different types of proof algorithms can be utilized within the disclosure to perform the invariant generation features described herein, and the disclosure is not limited to any particular proof algorithm. For example, the disclosure is applicable for use with, but not limited to, IC3, interpolation algorithms, and scalable binary decision diagrams (BDDs).

Proof algorithm 210 generates one or more invariants, which can include bounded invariants 215 and/or unbounded invariants 217. According to the described embodiments, each of these invariants reference specific design components, which can be present in more than one invariant. The sets of bounded invariants 215 and unbounded invariants 217 that are generated by proof algorithm 210 are provided as inputs to priority setting tool 220, which includes first priority function 222 and second priority function 224. First priority function 222 sets relative priorities for each of the bounded invariants received from proof algorithm 210, as well as the design component referenced by those invariants. As indicated, first priority function 222 is performed by one of a plurality of different algorithms, namely algorithms 3 and 4. Algorithms 2 and 3 are illustrated by flow charts 4 and 5, described hereafter. Second priority function 224 sets the priority of each unbounded invariant and the corresponding design components referenced in the unbounded invariants to a highest priority value. In one embodiment, second priority function 224 can also be utilized to select and/or identify those design components from the bounded invariants that have the highest relative priority values.

With the priority values of the design components determined, priority setting tool 220 forwards as an input to localization tool 230 a set of design components 225 with their relative priorities identified. In one embodiment, only those design components having a highest priority are forwarded to the localization tool 230 and the other design components with their respective priorities assigned are stored for access during subsequent refinement processes, if needed. Localization tool 230 includes abstraction module 235 which inserts cutpoints in the design for each of the design components that are not indicated as having a highest priority setting. The insertion of these cutpoints generates an initial abstracted design 245, which is sent through a verification tool 250 to determine whether there are spurious counterexamples within the initial abstracted design. Verification tool 250 evaluates abstracted design 245 and can generate proof or counterexamples as "verification results" to send to localization tool 230. Because localization overapproximates the behavior of the abstract FSM 245 relative to the original FSM 116, if a proof is obtained on abstract FSM 245, localization tool 230 produces an output of proof. In the case of counterexamples, localization tool 230 evaluates whether the counterexample is valid (i.e., not due to the abstraction) or spurious (i.e., due to the abstraction). If the counterexamples are valid, localization tool 230 produces an output of valid counterexamples as final verification results. When a spurious counterexample is found within the initial abstracted design, localization tool 230 calls the localization refinement process 240, and forwards the abstracted design 245 to be refined. Localization refinement process 240 involves one of two alternate algorithms that refine the abstracted design based on the priority values of the design components corresponding to one or more of the cutpoints within the abstracted design. Localization refinement process 240 then generates a refinement of the abstracted design and forwards the refinement to localization tool 230. Ultimately, IGAL tool 125 and/or multi-algorithm framework 200 generates higher quality abstractions, indicated as abstracted FSM 245.

Figure 3:
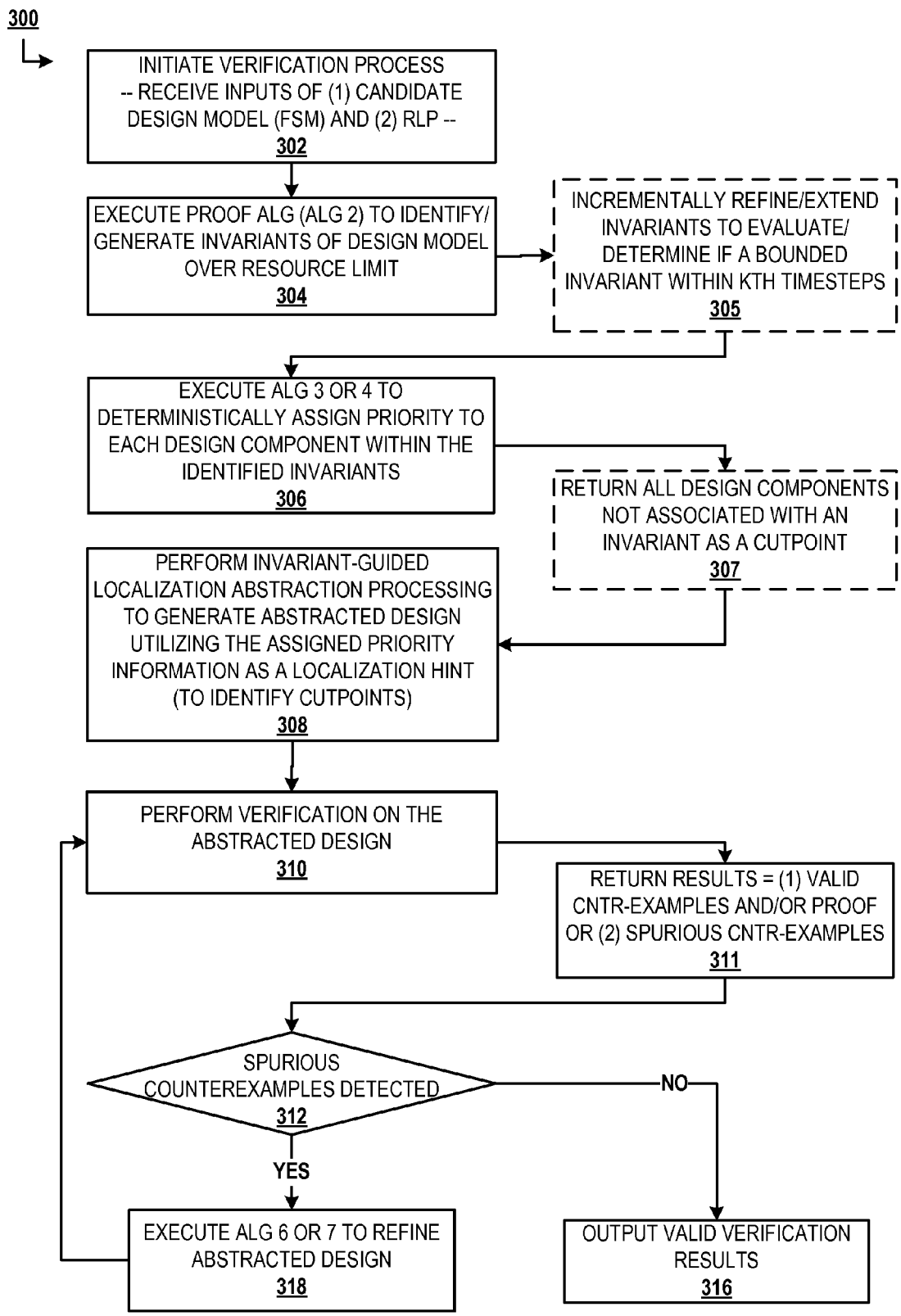
FIG. 3 is a flow chart illustrating a computer-implementable method for performing invariant-guided localization abstraction with priority associations, according to one or more embodiments.

Each of the flowcharts presented herein are described from the perspective of a computer-implemented method that is implemented by an example processor or computing device executing specific code associated with one or more of the functional modules indicated within IGAL tool 125. FIG. 3 is a flow chart of the computer-implemented method by which the above described multi-algorithm framework and specifically IGAL tool 125 operates on the initial inputs to generate the refined abstracted design. Method 300 begins at block 302 at which the processor initiates the verification process and receives initial inputs of the design model (FSM 116) and the resource limit parameter(s) 118. Method 300 then includes the processor executing the proof algorithm 210 to identify/generate invariants for (only) the pre-set resource limit. Specifically, with the example IC3 implementation, the proof algorithm 210 iterates over a series of timesteps corresponding to states extending from an initial state ($t_0$) to a subsequent state ($t_k$) at which a proof condition holds true over a first k timesteps for a set of bounded invariants identified at the respective states. According to one or more aspects, the set of bounded invariants holds true for a particular state from the initial state, and the invariants each refer to one or more components of the candidate design (FSM 116).

Method 300 also includes incrementally refining and extending a sequence of sets of invariants representing bounded invariants and determining a relevance of the one or more design components referenced in the invariant clauses by evaluating, for each invariant, whether the invariant is an unbounded invariant that is first introduced at a specific timestep between the initial and the kth timestep (block 305). Method 300 further provides deterministically assigning relative priorities to one or more design components referenced in the invariant based on the specific timestep at which the unbounded invariant is introduced (block 306). This process can be achieved via one or more of a plurality of different algorithms, presented herein as algorithms 2, 3, and 4. Method 300 then includes performing invariant-guided localization abstraction processing to generate an initial abstracted design (block 308). According to one aspect, the localization abstraction processing utilizes the assigned priority information (for the design components) as localization hints to identify cutpoints. With the initial abstracted design generated, method 300 includes performing verification on the initial abstracted design (block 310) and returning the verification results to the localization tool (block 311). The verification results can be one of valid counterexamples and/or proof of the design or spurious counterexamples. At decision block 312, method includes determining whether any spurious counterexamples are detected within the initial abstracted design. If no spurious counterexamples are detected, method 300 includes outputting the results of the verification and/or the abstracted design as valid verification results (block 316). In one embodiment, method 300 can include determining if additional refinement is desired, for example, where the verification is inconclusive, and returning to block 304 to perform additional invariant generation. From decision block 312, in response to detecting spurious counterexamples, method 300 executes a localization refinement algorithm (e.g., algorithm 6 or 7) on the initial abstracted design in order to refine the initial abstracted design (block 318).

The above generalized method introduces the concept of utilizing invariant-generation based verification techniques, such as IC3, to yield high-quality abstractions. Specifically, the method involves implementation of various algorithms to leverage invariant-generation based verification techniques to generate localization hints, which collectively improve upon the quality of abstractions produced under an abstraction-refinement loop. It is appreciated that, while IC3 is described herein as the proof algorithm utilized, there are numerous other algorithms that can be used within the disclosure to generate invariants, including but not limited to other SAT-based techniques other than IC3, such as "interpolation", and invariant generation techniques based upon BDDs. Also, while invariants can be expressed in terms of state variables, the disclosure provides a generalization of invariants referring to any design component (or "gate").

The specific description of the implementation of method 300 focuses on verification of safety properties on finite state machines (FSMs), which is just one example of the candidate design (116) to which the method can be applied. As presented herein, example FSM "M" is a tuple <X,I,T>, where "X" is a set of Boolean state variables, such that each assignment "s" in $\{0,1\}^X$ corresponds to a state of "M". The predicate "I" represents the initial states, and "T" is the transitions relation encoding possible transitions from current states to next states. Generally, any hardware design can be viewed as a FSM, where the state variables are "latches" or "registers", and the combinational logic and primary inputs in that design define the design's transition relation. Within this context, a predicate "P" represents a property being checked of the design, i.e., the "good states" which do not violate the property. Also, state variables and their negations are referred to as "literals", and disjunctions (conjunctions) of literals are referred to as "clauses" (or "cubes"). A conjunctive normal form (CNF) formula is then a conjunction of clauses. In the following descriptions, "X'" (X prime) is utilized as the notation representing next-state variables, and CNF formulas are derived from the FSMs.

Also, a sequence "pi" of states $t\_0, \ldots, t\_n$ is a path if each pair of consecutive states is consistent with the transition relation. If $t\_0$ is an initial state, the path is referred to as "initialized." A state "t" is reachable if there is an initialized path that ends in "t". Then, let "R" denote the set of all reachable states, and for k greater than or equal to (>=) 0, "R_k" denotes the set of states reachable by initialized paths of length at most "k". With these parameters established, the verification objective is to prove that "R" is a subset of "P".

A CNF formula "f" is an invariant if the formula holds in all reachable states "R". Furthermore, "f" is a k-step invariant if "f" holds in "R_k". A CNF formula "f" is an inductive invariant if the initial states "I" imply "f", and if for every state "s" which implies "f", all of the successor states "s'" must also imply "f" under the transition relation. If "f" is an inductive invariant and "f" implies "P", then it is guaranteed that "R" implies "P", and "f" is called an inductive proof of "P".

According to one aspect of the disclosure, an enhancement is made to an abstraction-refinement loop, which operates according to the below sequence of processes comprising Algorithm 1.
1. Receive FSM M
2. Determine the set of gates G to cutpoint in M; determine_cutpoints using assigned priorities of design components
3. Abstract FSM M by cutpointing G, yielding FSM Ma
4. Run verification algorithms on Ma
5. If any properties are proven correct on Ma, report properties correct on M
6. If any properties are falsified on Ma, resimulate the falsification traces on M
7. If any properties are falsified in this resimulation, report these failures for M
8. If any properties are not falsified on M, determine the set of cutpoints Ga to eliminate from Ma (using priority data) to rule out the spurious failure: determine_refined_cutpoints
9. Refine Ma by eliminating cutpoints Ga;
10. go to step 4

Algorithm 1

Enhanced Abstraction-Refinement Algorithm

Indicated by the bold fonts, steps 2 and 8 of Algorithm 1 determine the nature of the abstraction-refinement technique and utilize assigned priority data for the design components. With invariant-guided localization introduced by the disclosure, the abstract FSM itself is formed through cutpointing internal gates in the design, and various priority setting techniques are used to determine which gates to cutpoint for the initial abstraction (Step 2) and which cutpoints to eliminate for refinement (Step 8). In the described embodiments, traditionally bounded model checking are replaced with enhanced invariant-guided algorithms to make these choices.

Turning now to the specific algorithms identified within IGAL tool 125 (FIG. 2). Algorithm 2, which is proof algorithm 210, provides a method for generating or deriving bounded invariants and possibly generating unbounded invariants from the FSM 116, and using the invariants to generate a high-quality abstraction. As introduced above, the conjunction of clauses in F_1, . . . , F_k implies that k holds for the first k time-frames. One aspect of the disclosure involves creating a localization including only the design components appearing in these clauses, as illustrated by Algorithm 2, which includes the following processes:
1. Run invariant generation algorithm for a pre-specified resource limit (e.g., time-limit, depth-limit, memory-limit) yielding sets of bounded invariants F_1, . . . , F_k and unbounded invariants F; and
2. Identify design components "NG" referenced in any of F_1, . . . , F_k or F.

Algorithm II

Naïve Design Component Generation Algorithm

Figure 4:
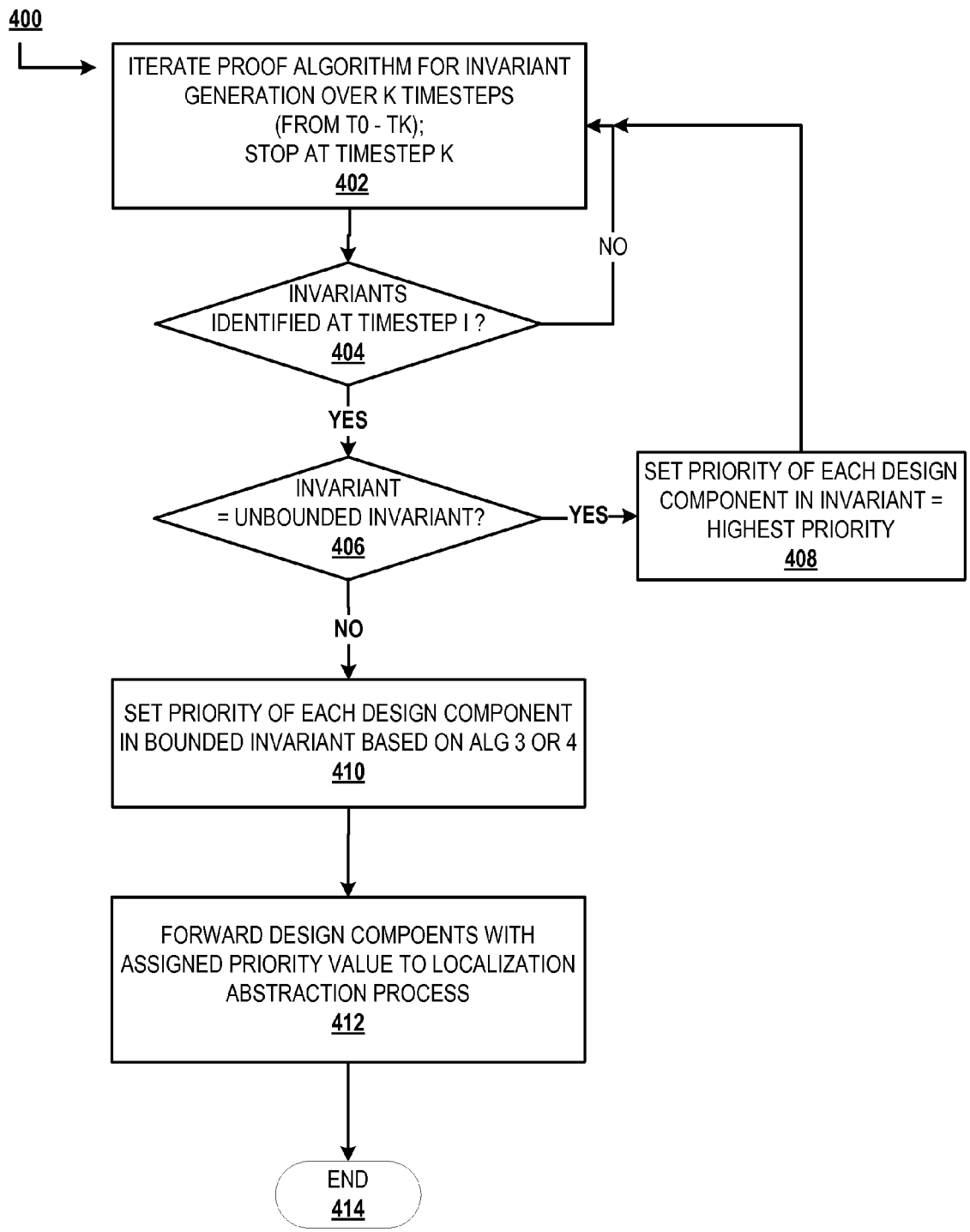
FIG. 4 is a flow chart illustrating a computer-implementable method for determining priorities of design components during generation of invariants from a design, according to one embodiment.
Figure 5:
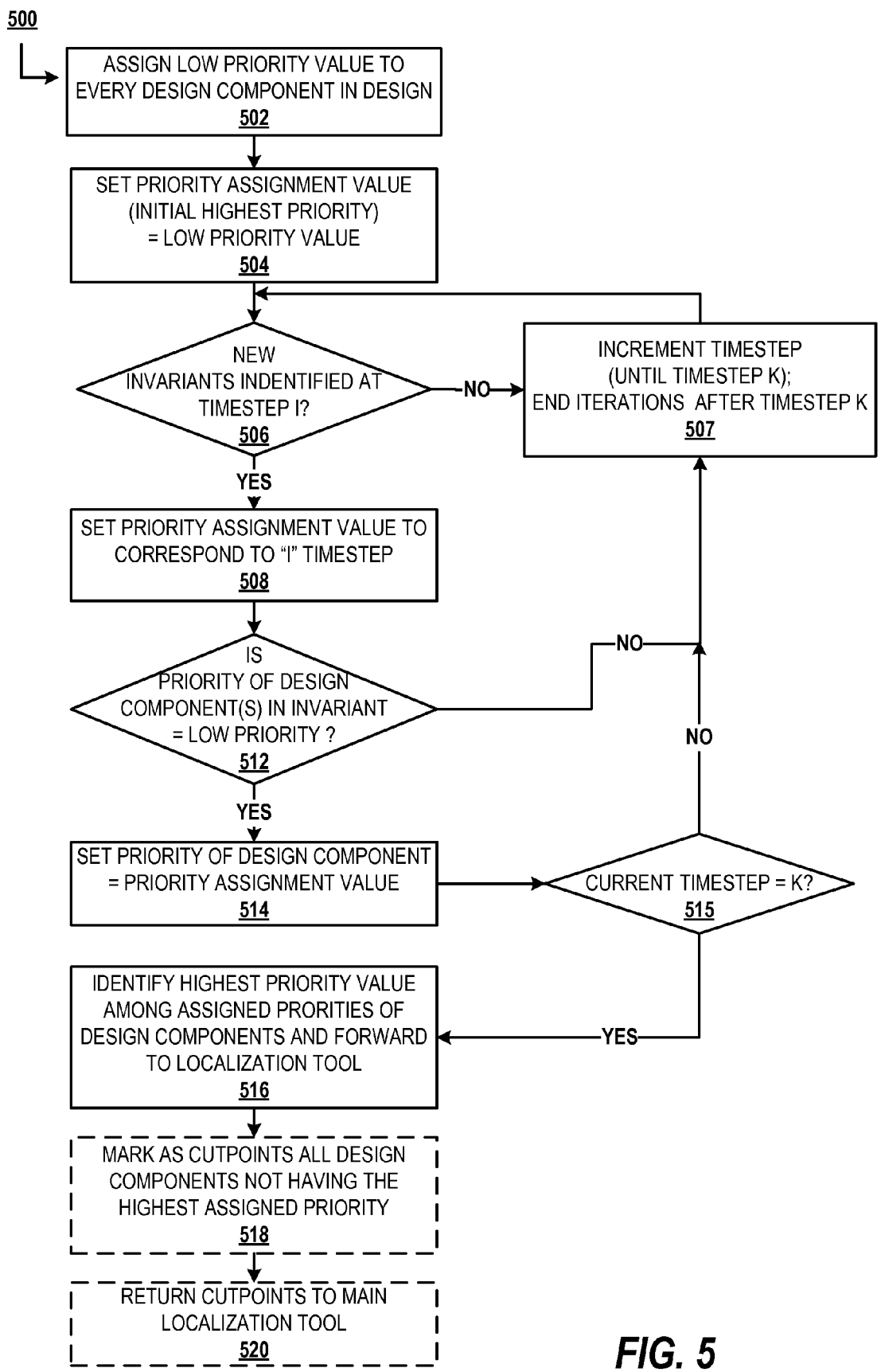
FIG. 5 is a flow chart of a first computer-implementable method for evaluating relative priorities of design components and identifying cutpoints during localization abstraction, according to one embodiment.
Figure 6:
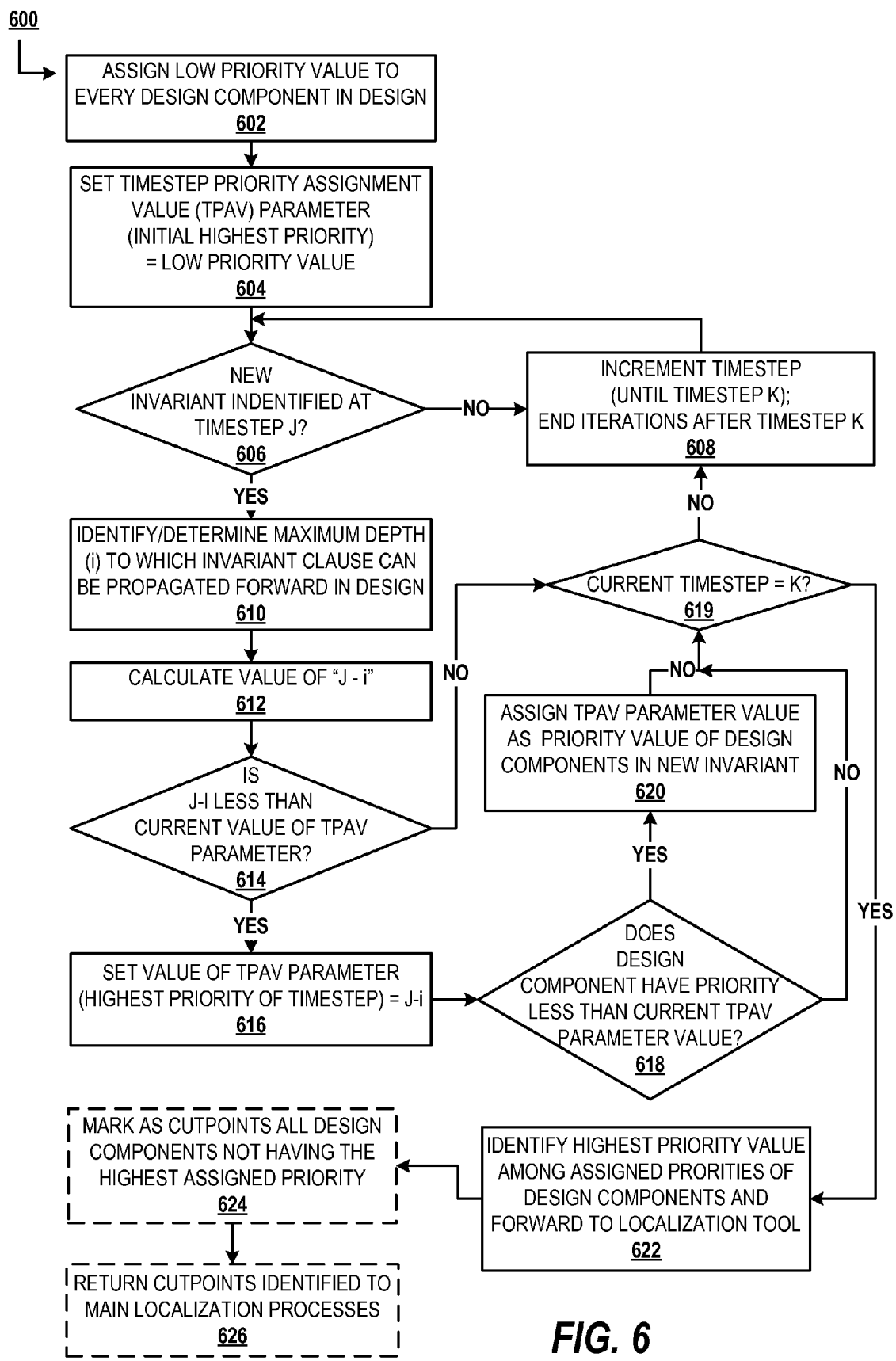
FIG. 6 is a flow chart a second computer-implementable method for evaluating relative priorities of design components and identifying cutpoints during localization abstraction, according to one embodiment.

The flow chart of FIG. 4 presents a method 400 by which each of the above two processes can be implemented on a candidate FSM. In addition to the above two processes of Algorithm II, the general method 300 also involves the priority setting tools 220, which involves processes that result in returning all design components not in "NG" as cutpoints "G". Within priority setting tool 220, one of two primary algorithms associated with priority setting tool 220 can be invoked to perform the priority evaluations, assignments, and other functions of priority setting tool 220. Collectively, with the above two invariant generation processes, the combination of processes can be referred to as a "sophisticated determine_cutpoints algorithm", which involves using an invariant-generation priority verification technique. Methods 500 and 600 of FIGS. 5 and 6 present specific implementation features related to each of the above two priority assigning and evaluating processes using either priority Algorithm 3 or priority Algorithm 4.

The flow chart of FIG. 4 presents an enhanced proof algorithm (with priority associations) that is executed via computer-implemented method 400. Method 400 begins at block 402 at which the processor or computing device iterates proof algorithm over k timesteps (from t0 to tk). According to one aspect, the iterations are stopped after the kth timestep, such that only an incomplete run of the proof algorithm is completed. At decision block 404, method 400 determines if there are any invariants identified at the current timestep i. If there are invariants identified at timestep i, method 400 further includes determining at decision block 406 whether the invariant is an unbounded invariant. This determination and subsequent priority assignment steps illustrated by method 400 are performed according to the described embodiment. However, in an alternate embodiment, both bounded and unbounded invariants are assigned priorities according to the presently described processes for assigning priorities to bounded invariants, and as such, the determination at decision block 406 would not be required. Returning to the description of method 400, in response to identifying one or more unbounded invariants, method 400 includes assigning a highest priority to each design component contained in each of the one or more unbounded invariants (block 408). However, for each invariant that is determined to be an unbounded invariant, method 400 includes setting the priority of the design components in the bounded invariant based on one of the priority setting functions described herein with reference to FIGS. 5 and 6 (block 410). Method 400 further includes forwarding each design component referenced within an invariant, along with the assigned priority value, to the localization abstraction process (block 412). Method 400 then ends at block 414.

The use of priority assignments within the disclosure stems from a recognition that some of the design components (e.g., state variables) may be unnecessary to complete a proof of correctness. Thus, one aspect of the disclosure relies on prior assignment techniques that provide additional information about the relevance of various design components from the bounded and unbounded invariants. This additional information can then be used to improve the abstraction quality during localization. In particular, for each invariant "c", consideration is given to (1) whether the invariant is a bounded or unbounded invariant, (2) the first bound "k" for which "c" was introduced, and (3) the maximal frame "i" that "c" can be pushed to relative to "k". For each design component, the number or the proportion of bounded invariants or clause sets that the design component belongs to can also be analyzed, in one or more embodiments. FIGS. 5 and 6 present two alternate methods of providing prioritized hints to localization based on the relative priority of various design components. Within the specific implementations, the relative priorities are represented by integers, with the convention that a lower number reflects a higher priority. With these established understandings, both methods provide alternate algorithms that can be independently run within priority setting tool 220. Example Algorithm 3 below represents the first of these two algorithms.

1. Assign every design component priori=infinity
 2. Assign highest_priority=infinity
 3. Run invariant generation algorithm for a pre-specified resource limit (e.g., time-limit, depth-limit, memory-limit), iteratively processing bounds 1, . . . , k. For each bound "i" in 1, . . . , k
 3. Identify clauses "c" derived when processing current iteration "i"
 4. If "c" is non-empty, and highest_priority=infinity, set highest_priority=i
 5. Identify design components "v" referenced in "c"
 6. If "v" has priority=infinity, change its priority to "i"
 7. Let F be the set of unbounded invariants. Optionally assign all design components referenced in F to priority=0, and set smallest_priority=0
 8. Return all design components which do not have priority equal to highest_priority as cutpoints "G"

Algorithm 3

Improved Determine_Cutpoints Algorithm—Using Invariant-Generation Verification Technique Algorithm 3 is encoded within method 500 (FIG. 5) and presents a first heuristic for assigning priorities. Method 500 commences at block 502 at which a processor or computing device initially assigns to each of the design components an initial priority value corresponding to a low priority. Additionally, method 500 also sets the highest priority assignment value equal to the low priority value (block 504). As utilized herein a low priority can be any arbitrary number that is not the highest possible priority, and the highest possible priority can be either zero (0) or one (1), depending on the priority scale being utilized. In one embodiment, the low priority initially assigned to each design component is infinity, and the priority of a design component may be increased during the invariant generation run. According to one aspect of the disclosure, whenever a new bounded invariant clause "c" is produced, all design components referenced by "c" that have assigned priority equal to the low priority initially assigned (e.g., infinity) have their priorities updated to the current bound "i" being processed. That is, after the $i^{th}$ run or iteration, the priority of each design component represents the earliest bound requiring a corresponding clause for a proof of validity of P, and the clauses for proofs of smaller bounds have higher priorities. This methodology takes into consideration that an abstraction including the design components with priorities $<=i$ will satisfy P for the first "i" time-frames. Also, in certain cases, assigning the highest priority (0) to all design components referenced in any derived unbounded invariants can also be beneficial.

Returning to the description of the figure, method 500 determines at block 506 whether one or more new invariant(s) are identified at timestep "i", and if not, method 500 increments the timestep and iterates until timestep k (block 507). According to one aspect, method ends the iteration for new invariants following timestep k. In response to identifying a new bounded invariant: method 500 includes setting the priority assignment value to correspond to the timestep i (block 508), and determining at decision block 512 if a currently assigned priority of one or more of the design components referenced by the new bounded invariant is the low priority. At block 514, method includes, in response to the currently assigned priority being the low priority, automatically updating a priority value assigned to each design component referenced in the new bounded invariant that has the low priority currently assigned to the priority assignment value (i.e., a new priority corresponding to a current timestep (i) being processed).

With the priority assigned for the invariants at that timestep, method 500 proceeds to decision block 515 at which method 500 determines if the current timestep is timestep k (i.e., the last timestep). In response to the current timestep being the final timestep (k), method 500 then includes identifying the highest priority value among all assigned priority values for design components referenced in the identified invariants and forwarding (or identifying) those highest priority components to the localization tool (block 516). In this manner, a final priority of each design component represents an earliest timestep at which the design component is referenced in a bounded invariant, and the design components corresponding to bounded invariants identified at earlier timesteps are assigned higher priorities than other design components corresponding to invariants identified at later timesteps.

According to one embodiment, and as further illustrated by the dashed blocks in FIG. 5, method 500 further includes, in response to any design component not having a priority equal to the highest priority assigned, identifying/marking the design component as a cutpoint (block 518). Finally, method 500 provides replacing the design component(s) not having the highest priority with a cutpoint within the abstracted design (block 520). It is appreciated that the processes described in blocks 518-520 are processes that are completed during localization abstraction processing, and the presentation within method 500 is solely to provide a full context for performing the prioritization processes of Algorithm 3.

In addition to the embodiment described above with reference to Algorithm 3 and method 500, an alternate embodiment of determining relative priorities of design components (and identifying cutpoints) is presented by the below Algorithm 4 and associated method 600 of FIG. 6. It is appreciated that Algorithm 4 can sometimes outperform Algorithm 3 in quality of abstractions depending on factors such as the candidate FSM 116 being verified and the value of RLP 118. Selection of either of Algorithm 3 or Algorithm 4 can be a design choice or an arbitrary selection, and where sufficient computing resources are present, both algorithms can be run concurrently or in sequence when executing the IGAL tool 125. With Algorithm 4, the priority of each design component is initially set to a lowest priority value, such as infinity, and the priority can be increased (i.e., the numerical priority value decreased) during the invariant generation run. Whenever a new bounded invariant (or invariant clause) "c" is produced while processing bound "j" that is "pushable" to frame "i" (which is less than or equal to "j"), the algorithm updates the priority of each design component referenced in "c" to "j−i" if that numerical value is smaller than the current priority assigned to that design component. In one or more specific implementations, additional benefits can be attained with Algorithm 4 by assigning the highest priority (0) to all state variables referenced in any derived unbounded invariants. Algorithm 4 is now presented as follows:

1. Assign every design component priori=infinity
2. Assign smallest_priority=infinity
3. Run invariant generation algorithm for a pre-specified resource limit (e.g., time-limit, depth-limit, memory-limit), iteratively processing bounds 1, . . . , k. For each bound "j" in 1, . . . , k
3. Identify clauses "c" derived when processing current iteration "j", and maximum depth "i" to which clause "c" can be propagated forward
4. If "c" is non-empty, and "j−i" is less than highest_priori, set highest_priori="j−i"
5. Identify design components "v" referenced in "c"
6. If "v" has priority larger than "j−i", change its priority to "j−i"
7. Let F be the set of unbounded invariants. Optionally assign all components referenced in F to priority=0, and set smallest_priority=0
7. Return all design components which do not have priority equal to highest_priority as cutpoints "G"

Algorithm 4

Alternate Improved Determine_Cutpoints Algorithm Using Invariant-Generation Verification Technique Algorithm 4 is encoded within method 600 (FIG. 6) and presents a second heuristic for assigning relative priorities to one or more design components. Method 600 commences at block 602 at which a processor or computing device initially assigns to each of the design components a priority value representing a low priority. Method 600 then includes setting a timestep priority assignment value (TPAV) parameter to the lowest priority value (block 604). According to one aspect, TPAV parameter provides the highest priority (lowest numerical value of priority) that can be assigned to a particular design component at a specific timestep j from timesteps i to k. At decision block 606, method 600 determines whether one or more new invariants are identified at timestep j, and if no new invariant(s) are identified, method 600 increments the timestep (=j+1) and continues searching for invariants until the bound k is reached as a final timestep (block 608). However, in response to a next invariant identified being a new invariant, method 600 includes determining a maximum depth (i) to which the next invariant can be propagated forward in the design (block 610). According to one aspect, the maximum depth is equivalent to a timestep i, which is less than a bounded timestep j at which the invariant was derived. Method 600 further includes: calculating a resultant value of j−i (block 612); and determining whether the resultant value is less than a current value of TPAV parameter (block 614). In response to the resultant value being less than that of the TPAV parameter, method 600 includes setting the value of the TPAV parameter to the resultant value (block 616). Then, at decision block 618, method 600 determines whether the current priority of each design component referenced by the new invariant is lower than (e.g., has a larger numerical priority value, where a smaller number equals a higher priority) the priority corresponding to the TPAV parameter value. Then, method 600 includes, in response to the current priority of the design component referenced by the new invariant being lower than the priority corresponding to the TPAV parameter, assigning the priority corresponding to the TPAV parameter to the design component referenced by the new bounded invariant (block 620). Notably, if the design components are determined at block 618 to already have a higher or equal priority assigned compared to the TPAV parameter, then no new priority assignment occurs.

With the priority assigned for the invariants at the current timestep, method 600 proceeds to decision block 619 at which method 600 determines if the current timestep is timestep k (i.e., the last timestep). In response to the current timestep being the final timestep (k), method 600 then includes identifying the highest priority value among all assigned priority values for design components referenced in the identified invariants and forwarding (or identifying) those highest priority components to the localization tool (block 622). As illustrated by the figure, the check of the current timestep in block 619 is also triggered in response to the check in decision block 614 and the check in decision block 618 yielding negative responses.

The above method 600 assumes that both bounded and unbounded invariants can be provided the same priority assignments based on the timestep at which the invariants are derived. In an alternate embodiment, however, the method can comprise first determining if a next invariant identified is an unbounded invariant and, in response to the next invariant being an unbounded invariant, automatically updating the priority value of each design component referenced within the next invariant to reflect a highest priority (or lowest priority value assignable).

Also, in yet another alternate embodiment, assigning relative priorities to one or more design components can include: initially assigning to each of the design components a priority value representing a low priority; and in response to identifying a new invariant during processing, automatically updating a priority value assigned to each design component referenced by the new invariant to reflect a highest priority. With this embodiment, the new invariant can be one of a bounded invariant and an unbounded invariant, as both are treated exactly the same.

As further shown by FIG. 6, in one embodiment, the cutpoint identification processes of the localization tool can be included as an extension of the priority determining method 600. Thus, method 600 can also include: identifying cutpoints by determining, for each design component referenced by an invariant, which design component has a priority that is not equal to a highest priority assigned among the design components (block 624); and returning to the localization process an identification of the cutpoints determined at block 624 (block 626).

Figure 7:
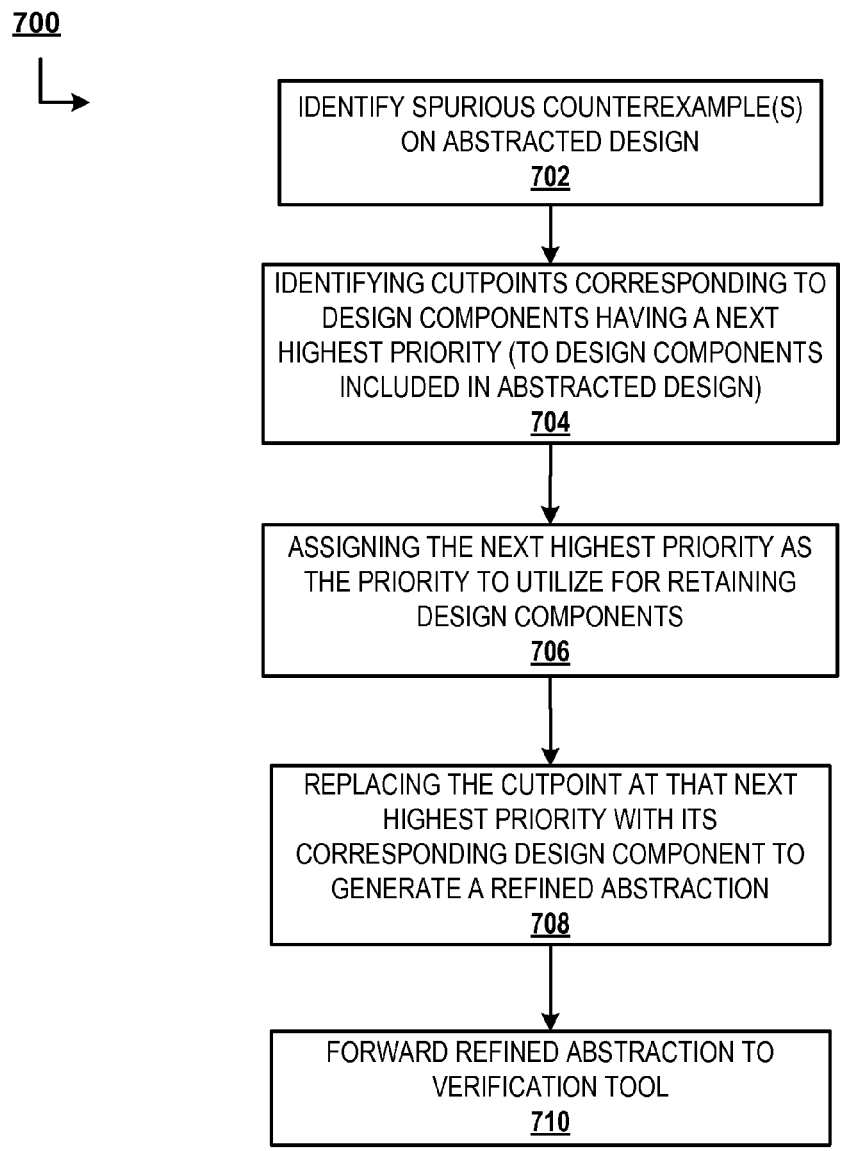
FIG. 7 is a flow chart illustrating a first computer-implementable method for refining an abstraction to eliminate spurious counterexamples, according to one or more embodiments.
Figure 8:
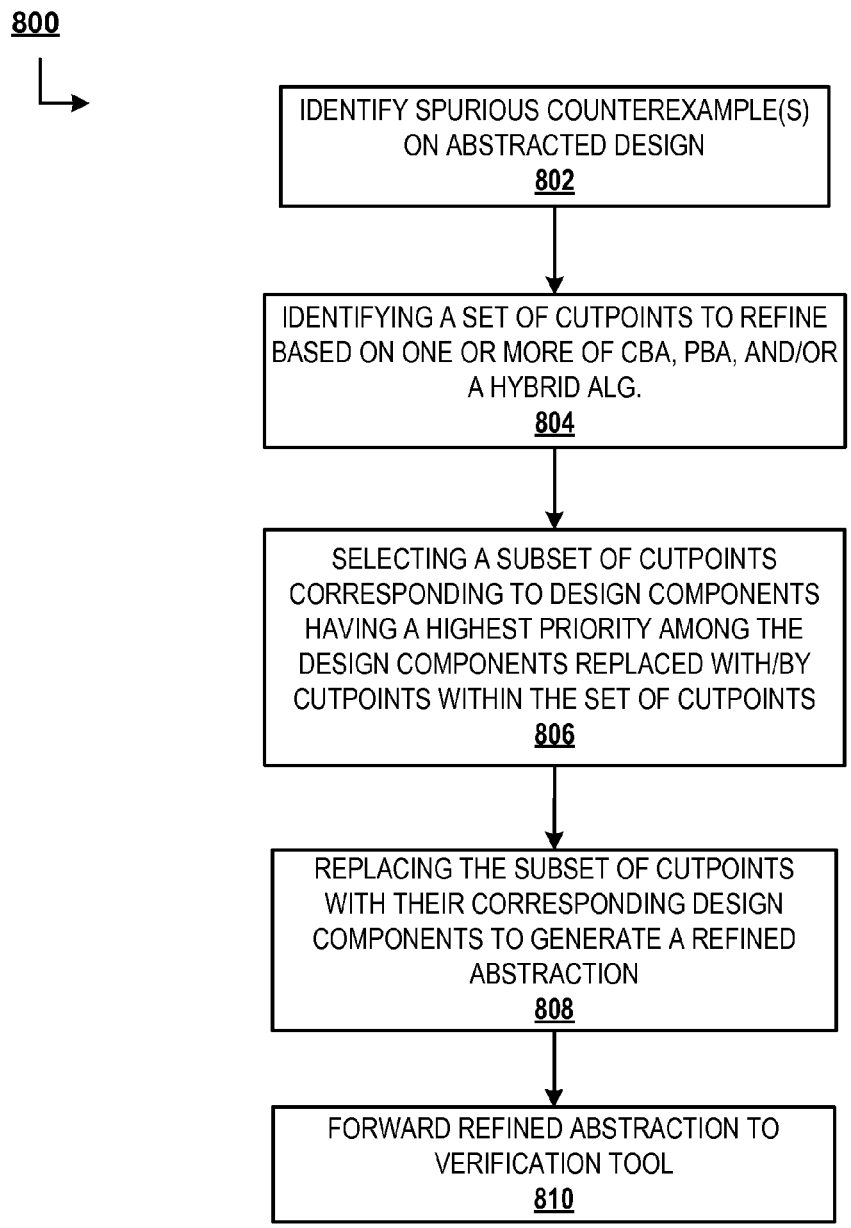
FIG. 8 is a flow chart illustrating a second computer-implementable method for refining an abstraction to eliminate spurious counterexamples, according to one or more embodiments.

According to the described embodiments, either or both of Algorithm 3 and associated method 500 and Algorithm 4 and associated method 600 can provide the set of design components to be used as cutpoints for the initial abstraction in Step 2 of Algorithm 1. These assigned priorities can also be utilized for subsequent refinement provided at Step 8 of Algorithm 1. These refinement processes are presented below with reference to flow charts of FIGS. 7 and 8 and associated Algorithms 5 and 6.

Because different heuristics work better for different problems, in one embodiment both priority algorithms can be run in parallel, and the process can then include selecting the highest-quality abstraction achieve. In an alternate embodiment, the two priority algorithms can be iteratively applied such that one heuristic (e.g., Algorithm 4) may further reduce the abstraction resulting from the other heuristic (Algorithm 3) or vice versa.

As illustrated within IGAL tool 125 and described above, the results of the priority algorithm(s) are forwarded to localization tool 230 which performs an abstraction on the design to generate an abstracted design. According to one embodiment, performing the localization abstraction process includes: initializing the localization abstraction process with every design component replaced by a cutpoint; performing satisfiability-based (SAT-based) bounded model checking (BMC) for a first timestep on the abstracted design; identifying and analyzing spurious counterexamples. The process further includes refining the localization abstraction by adding sufficient design components to the abstracted design to eliminate the spurious counterexamples. With this refinement process, the design components added are selected based on an analysis of assigned priorities for the design components. Then, in response to completion of elimination of spurious counterexamples at a specific timestep, the process includes performing proof-based abstraction (PBA) up to that specific timestep to eliminate unnecessary logic from the abstracted design. Finally, the localization abstraction process can include incrementing the timestep and iterating through processes including the performing SAT-based BMC, the identifying and analyzing, the refining, and the performing PBA processes up to the configured resource limit. Accordingly, the counterexample based abstraction (CBA) and proof-based abstraction (PBA) are interleaved utilizing the assigned priorities of the design components to perform the refining.

As further described with reference to method 300 (FIG. 3), the abstracted design is passed through verification tool 250, which outputs verification results that can include spurious counterexamples. The presence of these spurious counterexamples then triggers a localization refinement process performed via localization refinement tool 240. Thus, according to one aspect of the disclosure, an important issue for localization-refinement is determining what logic to refine if a spurious counterexample is encountered on the abstract design (see Step 8 of Algorithm 1: process determine_refined_cutpoints). The disclosure presented two alternate methods by which this refinement can be performed, and these alternate methods correspond to Algorithms 5 and 6, which respectively correspond to methods 700 and 800 of FIGS. 7 and 8. Algorithm 5, which includes removing as cutpoints all design components of the next-highest priority from those which had been included in the prior abstraction, includes the following processes:

1. Let highest_priority_last equal the highest_priority value used in the last call to determine_cutpoints or determine_refined_cutpoints
2. Set highest_priority equal to the highest_priority of any design component which is lower in priority than highest_priority_last
3. Return all design components which have priority equal to smallest_priority as refine cutpoints "Ga"

Algorithm 5

Refinement Algorithm Based Purely Upon Invariant-Based Priorities

Algorithm 5 is encoded within method 700 (FIG. 7) for refining the localization abstraction. The method 700 begins at block 702 by identifying spurious counterexamples on the abstracted design. Method 700 then includes a series of processes performed in response to encountering a spurious counterexample within the abstracted design. First, method includes identifying cutpoints (introduced to the design) that correspond to design components having a next highest priority (block 704). Next, method 700 includes assigning the next highest priority as the priority for use in determining which design components to retain (block 706). Finally, method 700 includes replacing each of the identified cutpoints with the corresponding design components to generate a refined abstraction (block 708). The refined abstraction can then be forwarded to the verification tool 250 for verification thereof (block 710).

Algorithm 5 provides a simple and elegant way to include increasingly-lower priority design components into the refined abstraction, based solely upon priorities assigned from invariant-based priorities. However, Algorithm 5 can occasionally result in the inclusion of a large number of design components because no "filtering" is performed among the design components re-introduced into the refined design. Algorithm 6 presents an alternate embodiment in which the invariant-based priorities are integrated within an abstraction-refinement process that can be proof-based, counterexample-based, or a hybrid of both methodologies. The processes of Algorithm 6 includes the following:

1. Let Ma be the current abstract design, and counterexample C be a spurious counterexample obtained on Ma
2. Use any variety of traditional counterexample-based, proof-based, or hybrid techniques to identify a set of cutpoints Ga to refine
3. Determine subset Gb of Ga which has the highest priority
4. Return Gb as state variables to refine Algorithm 6

Hybrid Refinement Algorithm Based Upon Invariant-Based Priorities to Direct Alternate Refinement Algorithms Algorithm 6 is embodied in method 800, which begins at block 802 with the identification of spurious counterexamples on the abstracted design. Then, method 800 includes performing a sequence of processes in response to encountering a spurious counterexample within the abstracted design. Method 800 includes identifying a set of cutpoints to refine by executing one or more of a counterexample-based algorithm, a proof-based algorithm, and a hybrid algorithm (block 804). Method 800 further includes selecting, from the identified set of cutpoints, a subset of cutpoints that correspond to design components that have a highest priority among the design components replaced with cutpoints within the identified set of cutpoints (block 806). Method 800 then includes replacing the subset of cutpoints corresponding to the design components having the highest priority with their corresponding design components to generate a refined abstraction (block 808). Finally, method 800 includes forwarding the refined abstraction to the verification tool 250 for verification thereof (block 810).

The above presented processes that comprise the disclosure provide an invariant-generation guided localization, which yields better abstractions than bounded model checking alone. One aspect of the disclosure involves utilizing counterexample-based and proof-based abstraction to complement each other to yield smaller abstractions. Additionally, invariant-generation techniques, such as IC3 and other proof techniques, offer yet another qualitatively-distinct heuristic guidance to complement these two abstraction techniques. Yet another aspect of the disclosure involves understanding that there are commonalities in how bounded model checking and invariant-generation techniques, such as IC3, attempt to justify a property failure via backward analysis of the design. Some of these justification attempts identify necessary logic and some attempts spuriously involve unnecessary logic. When utilized as the proof algorithm, IC3 provides an additional "filtering" of the impact of the spurious justification attempts, by using forward reachability analysis to generate bounded invariants where a potential failure justification may be eliminated. With this approach, justifications that cannot be eliminated by reachability analysis will not yield invariants, nor increase the priority of unnecessary design components, hence will not contribute to unnecessarily large and/or complex-to-verify abstractions.

Thus, with the above algorithms, the disclosure presents a method and system for guiding an abstraction-refinement process utilizing an invariant-generation process, in which design components (or state variables) not referenced by bounded or unbounded invariants are first chosen as cutpoints. Furthermore, invariants can be prioritized by whether they are bounded or unbounded, by the depth at which an invariant becomes necessary to satisfy a property being verified and/or by the depth to which the invariant is valid. These prioritizations can then be utilized to identify cutpoints in the design and/or to refine abstracted designs that yield spurious counterexamples.

In each of the flow charts above, one or more of the methods may be embodied in a computer readable medium containing computer readable code such that a series of functions are performed when the computer readable code is executed on a computing device. In some implementations, certain steps of the methods are combined, performed simultaneously or in a different order, or perhaps omitted, without deviating from the spirit and scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

As will be appreciated by one skilled in the art, aspects of the present disclosure may be embodied as a system, method or computer program product. Accordingly, aspects of the present disclosure may take the form of an entirely hardware embodiment or an embodiment combining software (including firmware, resident software, micro-code, etc.) and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, R.F, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present disclosure may be implemented using any combination of software, firmware or hardware. As a preparatory step to practicing the disclosure in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the disclosure. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the disclosure may be practiced by combining one or more machine-readable storage devices containing the code according to the present disclosure with appropriate processing hardware to execute the code contained therein. An apparatus for practicing the disclosure could be one or more processing devices and storage systems containing or having network access to program(s) coded in accordance with the disclosure.

Thus, it is important that while an illustrative embodiment of the present disclosure is described in the context of a fully functional computer (server) system with installed (or executed) software, those skilled in the art will appreciate that the software aspects of an illustrative embodiment of the present disclosure are capable of being distributed as a program product in a variety of forms, and that an illustrative embodiment of the present disclosure applies equally regardless of the particular type of media used to actually carry out the distribution.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method of invariant-guided abstraction within a design under verification, the method comprising:

initiating a verification process for an identified design;

generating by a processor of a computing device one or more invariants corresponding to the design under verification by executing a proof algorithm with an input comprising at least a portion of the design and a specified resource limit;

deterministically assigning priority information to the one or more invariants generated, and to components of said design referenced by said invariants; and generating an abstracted design model by performing invariant-guided localization abstraction on a design model utilizing the assigned priority information as a localization hint that results in abstractions that are at least one of (a) smaller abstractions and (b) easier to verify abstractions.

2. The computer-implemented method of claim 1, wherein executing the proof algorithm comprises:

establishing the specified resource limit to enable less than a complete run of the proof algorithm on the design model, wherein a pre-specified resource limit is selected from among a time limit, a depth limit, and a hardware resource usage limit; and executing the proof algorithm for only a preset limit, wherein the proof algorithm iterates over a series of timesteps corresponding to states extending from an initial state (t0) to a subsequent state (tk) at which a proof condition holds true over a first k timesteps for a set of bounded invariants identified at the respective states, wherein said set of bounded invariants hold true for a particular state from the initial state and wherein the invariants each refer to one or more components of said design.

3. The computer-implemented method of claim 2, further comprising:

incrementally refining and extending a sequence of sets of invariants representing bounded invariants and determining a relevance of the one or more design components referenced in the invariant clauses by:

evaluating, for each invariant, whether the invariant is an unbounded invariant that is first introduced at a specific timestep between the initial and the kth timestep;

deterministically assigning relative priorities to one or more design components referenced in the invariant based on the specific timestep at which the unbounded invariant is introduced;

determining for each design component referenced by an invariant, if the design component has a priority that is equal to a highest priority assigned among the design components; and in response to the design component not having a priority equal to the highest priority assigned, identifying the design component as a cutpoint and replacing the design component with the cutpoint within the abstracted design.

4. The computer-implemented method of claim 3, wherein assigning relative priorities to one or more design components comprises:

initially assigning to each of the design components an initial priority value corresponding to a low priority;

in response to identifying a new bounded invariant: determining if a currently assigned priority of one or more of the design components referenced by the new bounded invariant is the low priority; and in response to the currently assigned priority being the low priority, automatically updating a priority value assigned to each design component referenced in the new bounded invariant that has the low priority currently assigned to a new priority corresponding to a current timestep being processed, wherein a final priority of each design component represents an earliest timestep at which the design component is referenced in a bounded invariant and wherein design components corresponding to bounded invariants identified at earlier timesteps are assigned higher priorities than other design components corresponding to invariants identified at later timesteps.

5. The computer-implemented method of claim 3, wherein assigning relative priorities to one or more deign components comprises:

initially assigning to each of the design component a priority value representing a low priority;

determining if a next invariant identified is an unbounded invariant; and in response to identifying one or more unbounded invariants, assigning a highest priority to each design component contained in each of the one or more unbounded invariants.

6. The computer-implemented method of claim 3, wherein assigning relative priorities to one or more design components comprises:

initially assigning to each of the design components a priority value representing a low priority;

determining if a next invariant identified is a new invariant; and in response to the next invariant identified being a new invariant: determining a maximum depth (i) to which the next invariant can be propagated forward in the design, where the maximum depth is equivalent to a timestep i, which is less than a bounded timestep j at which the invariant was derived; calculating a resultant value of j-i; determining whether the resultant value is less than a previously assigned priority value for each design component referenced by the new invariant; and in response to the resultant value being less than the previously assigned priority value for a design component referenced by the new invariant, updating a priority value assigned to the design component referenced by the new invariant to the resultant value.

7. The computer-implemented method of claim 3, wherein assigning relative priorities to one or more design components comprises:

initially assigning to each of the design component a priority value representing a low priority; and in response to identifying a new invariant during processing, automatically updating a priority value assigned to each design component referenced by the new invariant to reflect a highest priority, wherein the new invariant can be one of a bounded invariant and an unbounded invariant.

8. The computer-implemented method of claim 3, wherein performing the localization abstraction process comprises:

initializing the localization abstraction process with every design component replaced by a cutpoint;

performing satisfiability-based (SAT-based) bounded model checking (BMC) for a first timestep on the abstracted design;

identifying and analyzing spurious counterexamples;

refining the localization abstraction by adding sufficient design components, to the abstracted design to eliminate the spurious counterexamples, wherein the design components added are selected based on an analysis of assigned priorities for the design components;

in response to completion of elimination of spurious counterexamples at a specific timestep, performing proof-based abstraction (PBA) up to that specific timestep to eliminate unnecessary logic from the abstracted design; and incrementing a timestep and iterating through processes including the performing SAT-based BMC, the identifying and analyzing, the refining, and the performing PBA processes up to the configured resource limit, wherein counterexample based abstraction (CBA) and proof-based abstraction (PBA) are interleaved utilizing the assigned priorities of the design components to complete the refining.

9. The computer-implemented method of claim 8, wherein refining the localization abstraction comprises:

in response to encountering a spurious counterexample within the abstracted design:

identifying cutpoints introduced to the design that correspond to design components having a next highest priority;

assigning the next highest priority as the priority for use in determining which design components to retain; and replacing each identified cutpoints with the corresponding design components to generate a refined abstraction.

10. The computer-implemented method of claim 8, wherein refining the localization abstraction comprises:

in response to encountering a spurious counterexample within the abstracted design:

identifying a set of cutpoints to refine by executing one or more of a counterexample-based algorithm, a proof-based algorithm, and a hybrid algorithm;

selecting, from the identified set of cutpoints, a subset of cutpoints that correspond to design components that have a highest priority among the design components replaced with cutpoints within the identified set of cutpoints; and replacing the subset of cutpoints corresponding to the design components having the highest priority with their corresponding design components to generate a refined abstraction.

11. A computer program product for invariant-guided abstraction within a design under verification the computer program product comprising:
- a computer readable device; and
- program code on the computer readable device, which program code is configured to be executed by a processor within a computing device to cause the computing device to:
  - initiate a verification process for an identified design;
  - generate by the processor one or more invariants corresponding to the design under verification by executing a proof algorithm with an input comprising at least a portion of the design and a specified resource limit, wherein the program code configured to cause the computing device to execute the proof algorithm comprises code configured to cause the computing device to:
  - establish the pre-specified limit to enable less than a complete run of the proof algorithm on a design model, wherein the pre-specified resource limit is selected from among a time limit, a depth limit, and a hardware resource usage limit;
  - execute the proof algorithm for only the preset limit, wherein the proof algorithm iterates over a series of timesteps corresponding to states extending from an initial state (t0) to a subsequent state (tk) at which a proof condition holds true over a first k timesteps for a set of bounded invariants identified at the respective states, wherein said set of bounded invariants hold true for a particular state from the initial state and wherein the invariants each refer to one or more components of said design;
  - deterministically assign priority information to the one or more invariants generated, and to components of said design referenced by said invariants; and
  - generate an abstracted design model by perform invariant-guided localization abstraction on the design model utilizing the assigned priority information as a localization hint that results in abstractions that are at least one of (a) smaller abstractions and (b) easier to verify abstractions.

12. The computer program product of claim 11, further comprising program code configured to cause the computing device to:
- incrementally refine and extend a sequence of sets of invariants representing bounded invariants and determine a relevance of the one or more design components referenced in the invariant clauses by:
  - evaluating, for each invariant, whether the invariant is an unbounded invariant that is first introduced at a specific timestep between the initial and the kth timestep;
  - deterministically assigning relative priorities to one or more design components referenced in the invariant based on the specific timestep at which the unbounded invariant is introduced;
- determining for each design component referenced by an invariant, if the design component has a priority that is equal to a highest priority assigned among the design components; and
  - in response to the design component not having a priority equal to the highest priority assigned, identifying the design component as a cutpoint and replacing the design component with the cutpoint within the abstracted design.

13. The computer program product of claim 12, wherein the program code configured to cause the computing device to assign relative priorities to one or more design components comprises program code configured to cause the computing device to:
- initially assign to each of the design components an initial priority value corresponding to a low priority; and
- in response to identifying a new bounded invariant: determine if a currently assigned priority of one or more of the design components referenced by the new bounded invariant is the low priority; and in response to the currently assigned priority being the low priority, automatically update a priority value assigned to each design component referenced in the new bounded invariant that has the low priority currently assigned to a new priority corresponding to a current timestep being processed, wherein a final priority of each design component represents an earliest timestep at which the design component is referenced in a bounded invariant and wherein design components corresponding to bounded invariants identified at earlier timesteps are assigned higher priorities than other design components corresponding to invariants identified at later timesteps.

14. The computer program product of claim 12, wherein the program code configured to cause the computing device to assign relative priorities to one or more design components comprises program code configured to cause the computing device to:
- initially assign to each of the design component a priority value representing a low priority;
- determine if a next invariant identified is an unbounded invariant; and
- in response to identifying one or more unbounded invariants, assign a highest priority to each design component contained in each of the one or more unbounded invariants.

15. The computer program product of claim 12, wherein the program code configured to cause the computing device to assign relative priorities to one or more design components comprises program code configured to cause the computing device to:
- initially assign to each of the design components a priority value representing a low priority;
- determine if a next invariant identified is a new invariant; and
- in response to the next invariant identified being a new invariant: determine a maximum depth (i) to which the next invariant can be propagated forward in the design, where the maximum depth is equivalent to a timestep i, which is less than a bounded timestep j at which the invariant was derived; calculating a resultant value of j-i; determine whether the resultant value is less than a previously assigned priority value for each design component referenced by the new invariant; and in response to the resultant value being less than the previously assigned priority value for a design component referenced by the new invariant, update a priority value assigned to the design component referenced by the new invariant to the resultant value.

16. The computer program product of claim 12, wherein the program code configured to cause the computing device to assign relative priorities to one or more design components comprises program code configured to cause the computing device to:
- initially assign to each of the design components a priority value representing a low priority; and
- in response to identifying a new invariant during processing, automatically update a priority value assigned to each design component referenced by the new invariant to reflect a highest priority, wherein the new invariant can be one of a bounded invariant and an unbounded invariant.

17. The computer program product of claim 12, wherein the program code configured to cause the computing device to perform the localization abstraction process comprises program code configured to cause the computing device to:
   initialize the localization abstraction process with every design component replaced by a cutpoint;
   perform satisfiability-based (SAT-based) bounded model checking (BMC) for a first timestep on the abstracted design;
   identify and analyzing spurious counterexamples;
   refine the localization abstraction by adding sufficient design components, to the abstracted design to eliminate the spurious counterexamples, wherein the design components added are selected based on an analysis of assigned priorities for the design components;
   in response to completion of elimination of spurious counterexamples at a specific timestep, perform proof-based abstraction (PBA) up to that specific timestep to eliminate unnecessary logic from the abstracted design; and
   increment a timestep and iterating through processes including the performing SAT-based BMC, the identifying and analyzing, the refining, and the performing PBA processes up to the configured resource limit, wherein counterexample based abstraction (CBA) and proof-based abstraction (PBA) are interleaved utilizing the assigned priorities of the design components to complete the refining.

18. The computer program product of claim 17, wherein the program code configured to cause the computing device to refine the localization abstraction comprises program code configured to cause the computing device to:
   in response to encountering a spurious counterexample within the abstracted design:
      identify cutpoints introduced to the design that correspond to design components having a next highest priority;
      assign the next highest priority as the priority for use in determining which design components to retain; and
      replace each identified cutpoints with the corresponding design components to generate a refined abstraction.

19. The computer program product of claim 17, wherein the program code configured to cause the computing device to refine the localization abstraction comprises program code configured to cause the computing device to:
   in response to encountering a spurious counterexample within the abstracted design:
   identify a set of cutpoints to refine by executing one or more of a counterexample-based algorithm, a proof-based algorithm, and a hybrid algorithm;
   select, from the identified set of cutpoints, a subset of cutpoints that correspond to design components that have a highest priority among the design components replaced with cutpoints within the identified set of cutpoints; and
   replace the subset of cutpoints corresponding to the design components having the highest priority with their corresponding design components to generate a refined abstraction.

20. A computing device for invariant-guided abstraction within a design under verification the computing device comprising a processor, an input device, an output device, and a memory having program code that is executed by the processor, wherein the computing device:
   initiates a verification process for an identified design;
   generates one or more invariants corresponding to the design under verification by executing a proof algorithm with an input comprising at least a portion of the design and a specified resource limit, wherein in executing the proof algorithm, the computing device:
   establishes the pre-specified limit to enable less than a complete run of the proof algorithm on a design model, wherein the pre-specified resource limit is selected from among a time limit, a depth limit, and a hardware resource usage limit; and
   executes the proof algorithm for only the preset limit, wherein the proof algorithm iterates over a series of timesteps corresponding to states extending from an initial state (t0) to a subsequent state (tk) at which a proof condition holds true over a first k timesteps for a set of bounded invariants identified at the respective states, wherein said set of bounded invariants hold true for a particular state from the initial state and wherein the invariants each refer to one or more components of said design;
   deterministically assigns priority information to the one or more invariants generated, and to components of said design referenced by said invariants; and
   generates an abstracted design model by performing invariant-guided localization abstraction on the design model to utilizing the assigned priority information as a localization hint that results in abstractions that are at least one of (a) smaller abstractions and (b) easier to verify abstractions.

21. The computing device of claim 20, wherein the computing device:
   incrementally refines and extends a sequence of sets of invariants representing bounded invariants and determines a relevance of the one or more design components referenced in the invariant clauses by executing code that causes the computing device to:
      evaluate, for each invariant, whether the invariant is an unbounded invariant that is first introduced at a specific timestep between the initial and the kth timestep;
      deterministically assign relative priorities to one or more design components referenced in the invariant based on the specific timestep at which the unbounded invariant is introduced;
      determine for each design component referenced by an invariant, if the design component has a priority that is equal to a highest priority assigned among the design components; and
      in response to the design component not having a priority equal to the highest priority assigned, identify the design component as a cutpoint and replace the design component with the cutpoint within the abstracted design.

22. The computing device of claim 21, wherein the computing device assigns relative priorities to one or more design components by executing code which causes the computing device to:
   initially assign to each of the design components an initial priority value corresponding to a low priority;
   in response to identifying a new bounded invariant: determine if a currently assigned priority of one or more of the design components referenced by the new bounded invariant is the low priority; and in response to the currently assigned priority being the low priority, automatically update a priority value assigned to each design component referenced in the new bounded invariant that has the low priority currently assigned to a new priority corresponding to a current timestep being processed, wherein a final priority of each design component represents an earliest timestep at which the design component is referenced in a bounded invariant and wherein design components corresponding to bounded invariants identified at earlier timesteps are assigned higher priorities than other design components corresponding to invariants identified at later timesteps; and in response to identifying one or more unbounded invariants, assign a highest priority to each design component contained in each of the one or more unbounded invariants.

23. The computing device of claim 21, wherein the computing device assigns relative priorities to one or more design components by executing code which causes the computing device to:

initially assign to each of the design components a priority value representing a low priority;

determine if a next invariant identified is an unbounded invariant;

in response to the next invariant being an unbounded invariant, automatically update the priority value of each design component referenced within the next invariant to reflect a highest priority; and in response to the next invariant identified being a new bounded invariant: determine a maximum depth (i) to which the next invariant can be propagated forward in the design, where the maximum depth is equivalent to a timestep i, which is less than a bounded timestep j at which the invariant was derived; calculating a resultant value of j-i; determine whether the resultant value is less than a previously assigned priority value for each design component referenced by the new bounded invariant; and in response to the resultant value being less than the previously assigned priority value for a design component referenced by the new bounded invariant, update a priority value assigned to the design component referenced by the new bounded invariant to the resultant value.

24. The computing device of claim 21, wherein the computing device assigns relative priorities to one or more design components by executing code which causes the computing device to:

initially assign to each of the design components a priority value representing a low priority; and in response to identifying a new invariant during processing, automatically update a priority value assigned to each design component referenced by the new invariant to reflect a highest priority, wherein the new invariant can be one of a bounded invariant and an unbounded invariant.

25. The computing device of claim 21, wherein the computing device performs the localization abstraction process by executing code which causes the computing device to:

initialize the localization abstraction process with every design component replaced by a cutpoint;

perform satisfiability-based (SAT-based) bounded model checking (BMC) for a first timestep on the abstracted design;

identify and analyzing spurious counterexamples;

refine the localization abstraction by adding sufficient design components, to the abstracted design to eliminate the spurious counterexamples, wherein the design components added are selected based on an analysis of assigned priorities for the design components;

in response to completion of elimination of spurious counterexamples at a specific timestep, perform proof-based abstraction (PBA) up to that specific timestep to eliminate unnecessary logic from the abstracted design; and increment the timestep and iterating through processes including the performing SAT-based BMC, the identifying and analyzing, the refining, and the performing PBA processes up to the configured resource limit, wherein counterexample based abstraction (CBA) and proof-based abstraction (PBA) are interleaved utilizing the assigned priorities of the design components to complete the refining.

26. The computing device of claim 25, wherein the computing device refines the localization abstraction by executing code which causes the computing device to:

in response to encountering a spurious counterexample within the abstracted design:

identify cutpoints introduced to the design that correspond to design components having a next highest priority;

assign the next highest priority as the priority for use in determining which design components to retain; and replace each identified cutpoints with the corresponding design components to generate a refined abstraction.

27. The computing device of claim 25, wherein the computing device refines the localization abstraction by executing code which causes the computing device to:

in response to encountering a spurious counterexample within the abstracted design:

identify a set of cutpoints to refine by executing one or more of a counterexample-based algorithm, a proof-based algorithm, and a hybrid algorithm;

select, from the identified set of cutpoints, a subset of cutpoints that correspond to design components that have a highest priority among the design components replaced with cutpoints within the identified set of cutpoints; and replace the subset of cutpoints corresponding to the design components having the highest priority with their corresponding design components to generate a refined abstraction.

* * * * *